United States Patent [19]

Skrzypczak

[11] Patent Number: 5,198,821
[45] Date of Patent: Mar. 30, 1993

[54] METHOD AND DEVICE FOR THE ON-LINE TESTING OF A MULTIPLE-SOURCE ANTENNA

[75] Inventor: Jean-Michel Skrzypczak, Paris, France

[73] Assignee: Thomson-CSF, Puteaux, France

[21] Appl. No.: 855,538

[22] Filed: Mar. 23, 1992

[30] Foreign Application Priority Data

Mar. 26, 1991 [FR] France ................. 91 03623

[51] Int. Cl.$^5$ .................. H01Q 3/00; G01R 29/10
[52] U.S. Cl. ..................... 342/360; 343/703
[58] Field of Search ........... 342/360, 368, 371, 372; 343/703

[56] References Cited

U.S. PATENT DOCUMENTS

| | | | |
|---|---|---|---|
| 4,517,570 | 5/1985 | Gray, Jr. ................... | 342/372 |
| 4,639,732 | 1/1987 | Acoraci et al. ............. | 342/371 |
| 4,926,186 | 5/1990 | Kelly et al. ................ | 342/360 |

FOREIGN PATENT DOCUMENTS 0053512 6/0982 European Pat. Off.

OTHER PUBLICATIONS

Saucier et al., "Direction Finding Using Correlation Techniques", Sanders Associates, Inc. p. 1–7.
IEEE Transactions on Antennas and Propagation, vol. AP-33, No. 12, Dec. 1985, New York, USA, pp. 1313–1327, J. Ronen, et al., "Monitoring Techiques for Phased-Array Antennas".
IEEE Transactions on Antennas and Propagation, vol. 36, No. 6, Jun. 1988, New York, USA, pp. 884–889.
E. M. Ferren, et al., "Near-Field Probe used as a Diagnostic Tool to Locate Defective Elements ...".
Patent Abstracts of Japan, vol. 6, No. 198 (-147)(1076), Oct. 7, 1982, & JP-A-57 108 772, Jul. 6, 1982.

*Primary Examiner*—Gregory C. Issing
*Attorney, Agent, or Firm*—Oblon, Spivak, McClelland, Maier & Neustadt

[57] ABSTRACT

Disclosed is a method and a device for the on-line testing of an antenna formed by a plurality of radiating sources. In an application for example to a secondary radar antenna, it is proposed to memorize the patterns ($\Sigma$, $\Delta$ and $\Omega$) of the antenna when all the radiating sources work properly and, when each of the source is malfunctioning in turn, to meaasure the radiation patterns of the antenna during its operation in IFF mode and then to compute the coefficients of correlation of these patterns with all the corresponding memorized radiation patterns. The value of the coefficients obtained enables the precise determining and localizing of the malfunction. It is furthermore proposed to use a ground beacon responding to all the interrogations on several antenna rotations.

10 Claims, 3 Drawing Sheets

METHOD AND DEVICE FOR THE ON-LINE TESTING OF A MULTIPLE-SOURCE ANTENNA

BACKGROUND OF THE INVENTION

1. Field of the Invention

The present invention relates to a method and device for the on-line testing (namely the testing during operation) of an antenna formed by a plurality of radiating sources.

A particular field of application of the invention relates to the antennas of monopulse type secondary radars, enabling the radiation in space of the pulses produced by an IFF (Identification Friend or Foe) interrogator and the picking up of responses, if any, from the interrogated aircraft. Antennas such as these are constituted by a plurality of radiating elements, called columns. It is very difficult to find out, on the spot, if one, or more of these columns is malfunctioning. Moreover, should there be a decline in the performance characteristics of the antenna, it is not possible to localize the column or columns in question with precision.

2. Description of the Prior Art

A known practical method of localizing the columns consists in placing a detector successively before each column to ascertain that the radiation from these columns is really that expected. The drawback of such a method lies in the interaction of the radiation patterns of the columns neighboring the tested column, which gives low precision to the measurements made. Furthermore, this method calls for the temporary stoppage of the antenna in its functions of interrogation and of receiving responses from aircraft.

There also exist various methods that work directly on the radiation pattern of the antenna and are based on the following principles:

- the mean level of the minor lobes may enable the detection of a malfunction. In fact, this method is ruled out for it does not enable the extraction of a reliable information element relating to the end columns for which the variations of the mean level on the minor lobes are too small;
- the characteristic function of the alignment of the dipoles gets cancelled as many times as there are radiating elements in the alignment. The observation of the number of zeros should therefore enable the detection of malfunctions. However, in practice, this is an unreliable method in the sense that, in practice, reflections on obstacles may cause the zeros to disappear;
- the radiation pattern of an antenna is deduced from the Fourier transform of the illumination of this antenna. In computing the reverse Fourier transform, it should therefore be possible to reconstitute the aspect of the illumination of the antenna and thus detect holes at the position of the malfunctioning columns. In fact, this information cannot be exploited for it is not possible to recover the essential information of the signal, namely its phase.

The object of the invention is to overcome the above-mentioned drawbacks by proposing a method and a device for the on-site testing of the operation of a multiple-source antenna that enables the precise localizing of the malfunctioning radiation source or sources, without hampering the prime function of this antenna.

Although the description of the method and of the device according to the invention is made in the context of the application to a secondary radar antenna, it is important at the very outset to note that the invention is not limited to this particular application, as shall be seen hereinafter.

SUMMARY OF THE INVENTION

More precisely, an object of the invention is a method for the on-line and on-site testing of an antenna comprising a plurality of radiating sources wherein said method consists in:

- constituting a library of radiation patterns of the antenna, firstly when all the radiating sources work normally and, secondly, when at least one of said sources is deliberately put into a state of malfunctioning;
- measuring the radiation pattern of the antenna during its on-site operation
- computing the coefficient of correlation of said radiation pattern with each of the radiation patterns contained in said library;
- computing the maximum value of the coefficient of correlation so as to detect a malfunction, if any, in one or more of said radiating sources.

The invention also relates to a device for the on-line and on-site testing of an antenna comprising a plurality of radiating sources wherein said device comprises:

- first means for the measuring and memorizing, in a library, of the radiation patterns of the antenna, firstly when all the radiating sources work normally and, secondly, when at least one of said sources is deliberately put into a state of malfunctioning;
- second means to measure the radiation pattern of the antenna during its on-site operation;
- means to compute the coefficient of correlation of the radiation pattern of the antenna and of each pattern contained in said library;
- means to compute the maximum value of the coefficient of correlation to detect a malfunction if any.

BRIEF DESCRIPTION OF THE DRAWINGS

The testing method and device shall be understood more clearly from the following description, made with reference to the appended figures, of which.

MORE DETAILED DESCRIPTION

Figure 1:
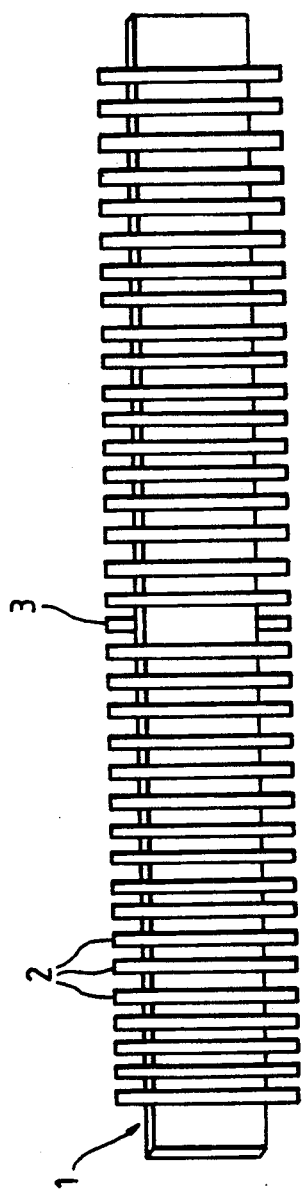
FIG. 1 shows a view of the front face of a secondary radar antenna.
Figure 2:
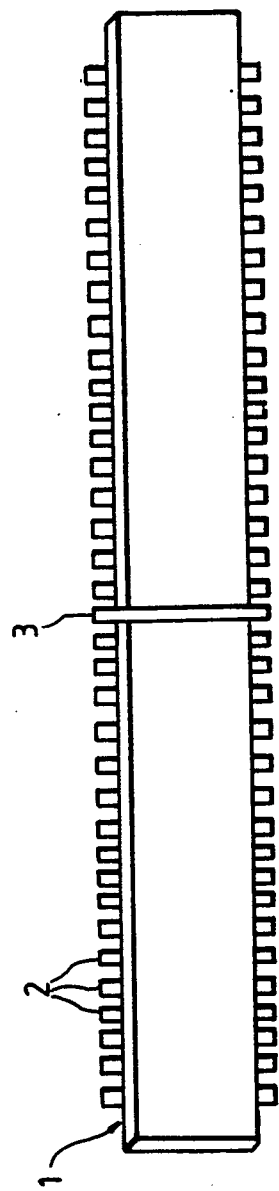
FIG. 2 shows a view of the rear face of this very same antenna.
Figure 3:
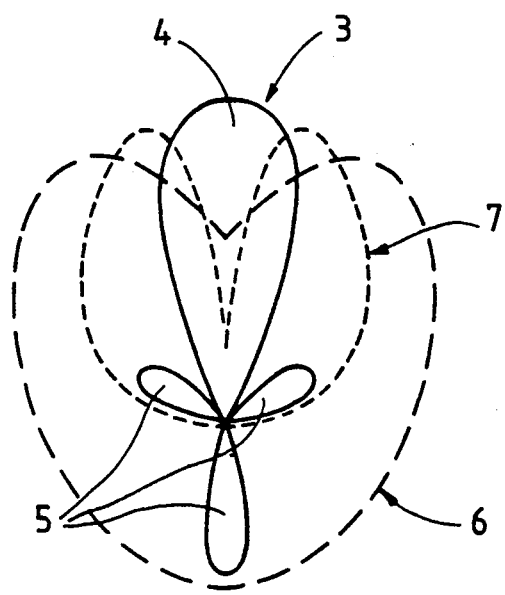
FIG. 3 shows the three radiation patterns of the foregoing antenna.

FIGS. 1 and 2 respectively show the front face and the rear face of a monopulse type secondary radar antenna. This antenna has a beam 1 to which there are fixed radiating columns (2, 3), the number of these columns being 36 for example, the 35 columns 2 being placed on the front of the antenna and the column 3 being placed in the rear. The radiation may be obtained, for example, by a plurality of radiating dipoles placed on each column. The antenna is designed, firstly, to radiate, in space, the signals prepared by an interrogator (not shown) and, secondly, to pick up the responses coming from transponders mounted on the aircraft. To this end, it has three radiation patterns shown schematically in FIG. 3, obtained by distributions, that are different in amplitude and in phase, of the energy among the 36 radiating columns. The antenna radiates firstly a pattern ($\Sigma$) 3 having a directional major lobe 4 surrounded by minor lobes 5, through which it sends out a pair of interrogation pulses. To prevent a transponder on board an aircraft from responding to the pulses sent by the minor lobes 5, a third pulse interposed with the foregoing ones is sent out along the quasi-omnidirectional radiation pattern ($\Omega$) 6, which completely covers the minor lobes 5. Thus, only the aircraft located in the zone of coverage of the major lobe 4 are led to respond to the interrogations of the antenna. The last pattern 7, or pattern ($\Delta$) can be used to increase the precision as regards the position of the aircraft which sends out a response.

Figure 4:
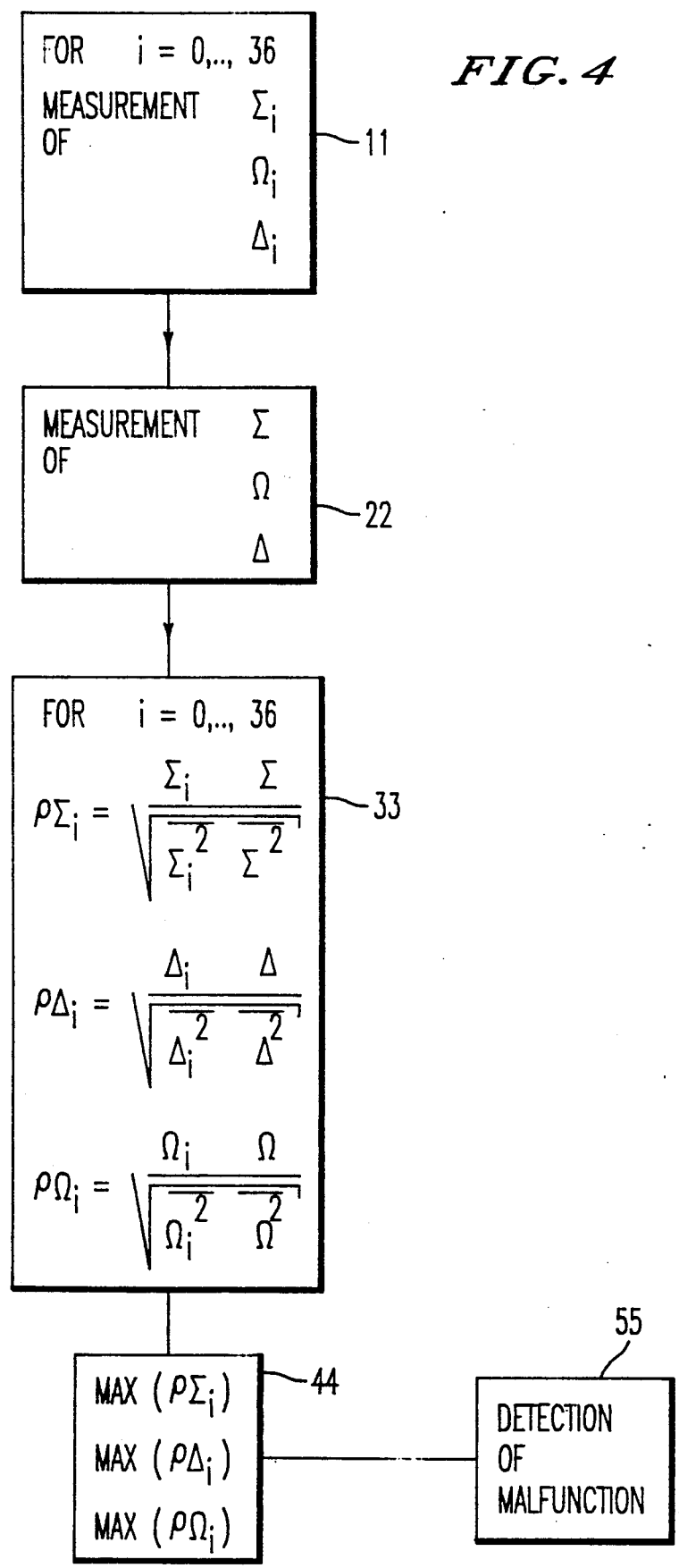
FIG. 4 is a block diagram representing steps to be carried out for the test according to the invention.

FIG. 4 explains the different steps of the method according to the invention.

A first step referenced 11 consists of the memorizing, in a library, of the three patterns $\Sigma_i$, $\Omega_i$ and $\Delta_i$, measured on-site for example, of the antenna (i representing the column subscript) in the particular configuration where the column i is deliberately put into a state of malfunctioning. The subscript O corresponds to the case where no column is in a state of malfunctioning.

The need to use the triplet ($\Sigma$, $\Delta$, $\Omega$) of the radiation patterns is justified by the fact that one pattern alone is not sufficient for the precise localizing of a column that is malfunctioning. Indeed, the energy applied to the input of the channel ($\Sigma$) of the antenna is distributed between the 35 front columns with the same phase and with amplitudes that decrease from the center of the antenna towards the ends. Thus, the pattern ($\Sigma$) enables the detection of only the malfunctioning of the columns close to the center of the antenna with, additionally, a degree of ambiguity on the relative position of these columns with respect to this center. For the radiation pattern ($\Delta$), the 17 columns located to the left of the central column are fed in phase opposition with respect to the 17 columns located to the right. This makes it possible to remove the foregoing ambiguity. Furthermore, the distribution in amplitude of the pattern ($\Delta$) enables the processing, more specifically, of the columns placed on either side of the center of each half of the antenna. Finally, the pattern ($\Omega$), for which only the rear central column is fed in phase opposition with respect to the other 35 columns, enables the detection of a malfunction in this rear column.

The second step of the method according to the invention, referenced 22, consists in the on-site measurement, at predetermined times, of the three radiation patterns $\Delta$, $\Omega$, $\Delta$ of the antenna during its operation in IFF interrogation mode.

The third step, referenced 44, is that of the computation of the correlation coefficient for each pair of signals ($\Sigma_i$, $\Sigma$), ($\Delta_i$, $\Delta$), ($\Omega_i$, $\Omega$), it being known that this correlation coefficient for a pair of signals ($x_i(t)$, ($x(t)$) is given by the relationship:

$$\rho_{xi} = \frac{\overline{x_i(t)x(t)}}{\sqrt{\overline{x_i^2(t)} \cdot \overline{x^2(t)}}}$$

This coefficient $\rho_{xi}$ enables the assessment of the resemblance of the two signals $x(t)$ and $x_i(t)$, it being known that the maximum resemblance is achieved theoretically for $\rho_{xi}=1$ and the total decorrelation for $\rho_{xi}=0$.

The steps 44 and 55 thus enable the detection of the malfunctioning column i. More precisely, the step 44 enables the computation of the maximum values of the coefficients $\rho_{\Sigma i}$, $\rho_{\Delta i}$ and $\rho_{\Omega i}$. These values are not necessarily 1 in practice for the resemblance is never perfect. The column i identified as being probably malfunctioning by the step 55 corresponds to the highest coefficient of correlation. Should several columns be malfunctioning, the operation will be reiterated from the step 33 onwards in order to examine all the columns. Instead of carrying out iteration it is equally possible to design a library that is bigger than the foregoing one, containing configurations of malfunctions on more than one column.

The invention also proposes a device to implement the method as described here above.

The steps 11 and 22 of the method are on-site readings of radiation patterns. To do this, a ground beacon, placed within the optical range of the radar (typically from 1 km to 50 km), may be used. This beacon works as an aircraft transponder except for the fact that it responds to all interrogations sent by the antenna. The reading of the three patterns ($\Sigma$), ($\Delta$) and ($\Omega$) is done by measuring the peak amplitudes of the three pulses constituting the response of the beacon. This reading is done on several antenna rotations, thus making it possible to obtain very precise radiation patterns. The idea is based on the fact that the position of the antenna is generally known through an optical coder for example, comprising n bits and having a resolution of $360°/2^n$. It is possible to obtain very precise radiation patterns by measuring the peak amplitudes of the responses of the beacon for a position of the antenna that varies from 0° to 360° by a pitch that approaches the resolution of the encoder as closely as possible. To obtain all the values, it is necessary to make the measurements on several antenna rotations. However, this is not a constraint for the antenna continues to fulfill its function of an IFF interrogator.

This device thus enables a very precise measurement of, firstly, the triplets ($\Sigma_i$, $\Delta_i$, $\Omega_i$) which must subsequently be memorized in a library and, secondly, the triplet ($\Sigma$, $\Delta$, $\Omega$) with the aim of detecting one or more possible malfunctions. The rest of the testing device may be made by any means that make it possible to compute the three coefficients of correlation $\rho_{\rho i}$, $\rho_{\Delta i}$ and $\rho_{\Omega i}$ search for their maximum value and thus determine the column that is probably malfunctioning.

As has already been noted here above, the invention is absolutely not limited to the antennas of monopulse type secondary radars and may be extended to all cases of antennas having at least two radiating sources.

Furthermore, the constitution of the library may also be done by simple mathematical computation.

What is claimed is:

1. A method for the on-line and on-site testing of an antenna comprising a plurality of radiating sources wherein said method consists in:

constituting a library of radiation patterns of the antenna, firstly when all the radiating sources work normally and, secondly, when at least one of said sources is deliberately put into a state of malfunctioning;

measuring the radiation pattern of the antenna during its on-site operation;

computing the coefficient of correlation of said radiation pattern with each of the radiation patterns contained in said library;

computing the maximum value of the coefficient of correlation so as to detect a malfunction, if any, in one or more of said radiating sources.

2. A method according to claim 1, wherein the library contains the radiation patterns of the antenna when each of the radiating sources is put into a state of malfunctioning in turn.

3. A method according to claim 1, wherein the radiation patterns contained in said library are measured on site.

4. A method according to claim 2, wherein the radiation patterns contained in said library are measured on site.

5. A method according to any of the claims 1 to 4, wherein said antenna is a monopulse type secondary radar antenna, and wherein its operation is represented by a triplet of radiation patterns.

6. A method according to claim 5, wherein said triplet is constituted by a sum pattern ($\Sigma$), a difference pattern ($\Delta$) and an quasi-omnidirectional pattern ($\Omega$).

7. A method according to claim 6, wherein the coefficient of correlation is computed for each radiation pattern constituting said triplet.

8. A device for the on-line and on-site testing of an antenna constituted by a plurality of radiating sources, wherein said device comprises:

first means for the measuring and memorizing, in a library, of the radiation patterns of the antenna, firstly when all the radiating sources work normally and, secondly, when at least one of said sources is deliberately put into a state of malfunctioning;

second means to measure the radiation pattern of the antenna during its on-site operation;

means to compute the coefficient of correlation of the radiation pattern of the antenna and of each pattern contained in said library;

means to compute the maximum value of the coefficient of correlation to detect a malfunction if any.

9. A device according to claim 8, wherein said means carry out the measurements of the radiation patterns on site.

10. A device according to either of the claims 8 or 9, wherein said antenna is a monopulse type secondary radar antenna and wherein said means for the on-site measurement of the radiation patterns are constituted by a ground beacon, placed within the optical range of the radar and responding to all the interrogations of the antenna, and by means to measure the peak amplitude of the responses of said beacon on several antenna rotations.

* * * * *